United States Patent
Bergervoet et al.

(10) Patent No.: US 7,183,833 B2
(45) Date of Patent: Feb. 27, 2007

(54) THREE-PHASE MIXER-SYSTEMS

(75) Inventors: Jozef Reinerus Maria Bergervoet, Eindhoven (NL); Eduard Ferdinand Stikvoort, Eindhoven (NL)

(73) Assignee: NXP B.V., Eindhoven (NL)

( * ) Notice: Subject to any disclaimer, the term of this patent is extended or adjusted under 35 U.S.C. 154(b) by 72 days.

(21) Appl. No.: 10/538,103

(22) PCT Filed: Nov. 12, 2003

(86) PCT No.: PCT/IB03/05144

§ 371 (c)(1),
(2), (4) Date: Jun. 8, 2005

(87) PCT Pub. No.: WO2004/054092

PCT Pub. Date: Jun. 24, 2004

(65) Prior Publication Data

US 2006/0063504 A1    Mar. 23, 2006

(30) Foreign Application Priority Data

Dec. 11, 2002   (EP)  .................................. 02080247

(51) Int. Cl.
*G06G 7/16* (2006.01)
(52) U.S. Cl. ...................................... 327/359; 455/333
(58) Field of Classification Search ................ 327/356, 327/359; 455/333
See application file for complete search history.

(56) References Cited

U.S. PATENT DOCUMENTS 5,483,695 A    1/1996   Pardoen
5,708,383 A *  1/1998   Lee ............................. 327/356
7,078,969 B2 * 7/2006   Bhattacharjee et al. ..... 330/254

FOREIGN PATENT DOCUMENTS

WO    WO 98/45942 A2    10/1998

OTHER PUBLICATIONS

"CMOS Mixers and Polyphase Filters for Large Image Rejection", by Farbod Behbahani et al, IEEE Journal of Solid-State Circuits, vol. 36, No. 6, Jun. 2001.

* cited by examiner

*Primary Examiner*—Kenneth B. Wells

(57) ABSTRACT

Mixer-systems for up/down-converting frequencies comprise many components: in case of balanced quadrature conversion, some parts will show a fourfold repetition (insight). By creating a three-phase mixer-system (10,40), less components will be necessary (basic idea). The sub-signals in the group of sub-signals at the sub-outputs have phase differences being present between two subsequent sub-signals within an interval of 100–140 degrees, which makes these sub-signals already (substantially) balanced. In case of said phase differences being each within an interval of 118–122 degrees, the sub-signals are even better balanced, and when being 120 degrees, the sub-signals are perfectly balanced. A group of transistors (11–13,14–16, 17–19,41–43,44–46,47–49) per sub-input (1,2,3) switches and/or amplifies the sub-signals at the sub-inputs. In an active mixer-system (10), said groups of transistors (11–13, 14–16,17–19) are switched by further transistors (20–22). In a passive mixer-system (40) said groups of transistors (41–49) are in dependence of the group of sub-signals at the further sub-inputs (4,5,6) switched from low/high to high/low impedance.

10 Claims, 2 Drawing Sheets

THREE-PHASE MIXER-SYSTEMS

Figure 1:
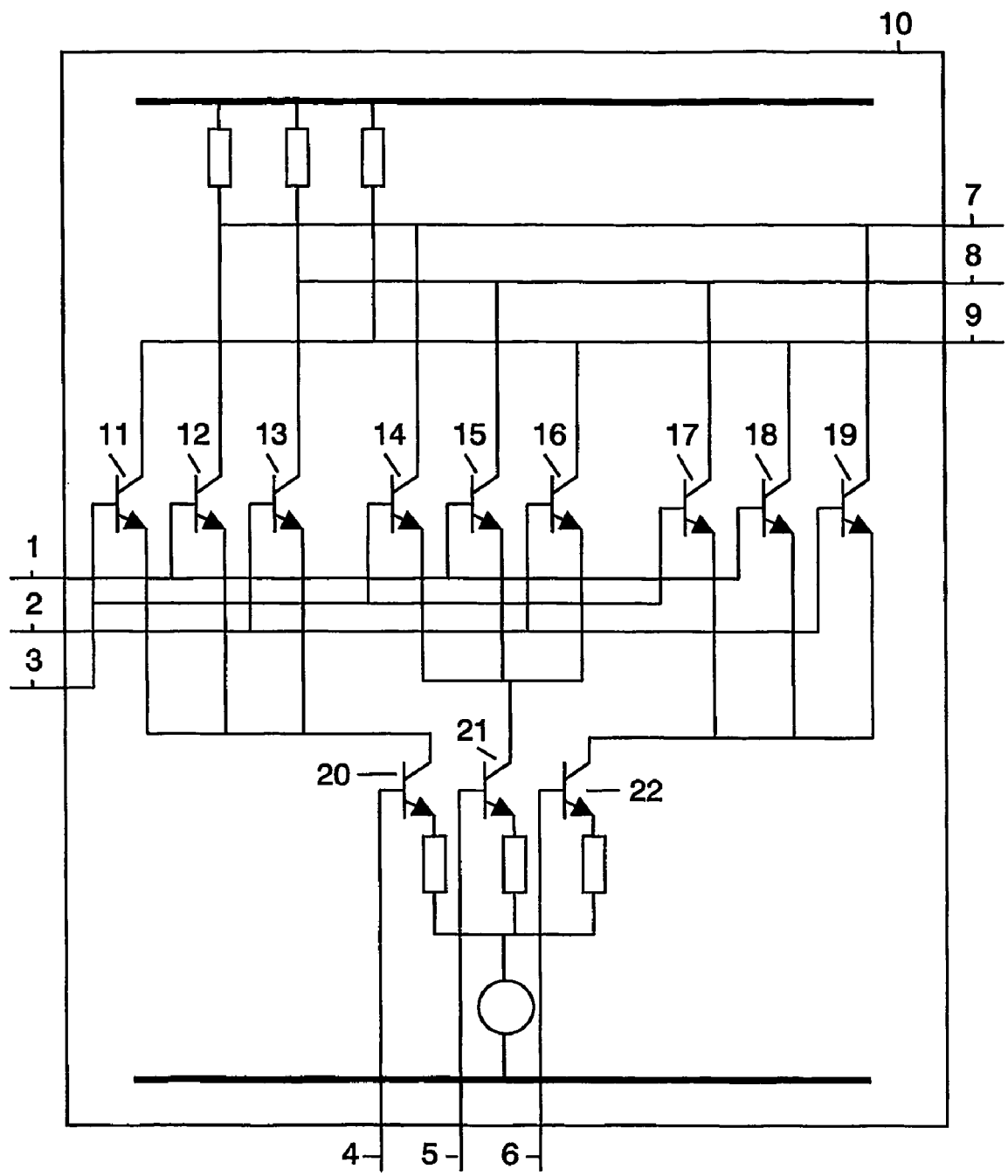

The invention relates to a mixer-system for converting a frequency of an input signal into a different frequency of an output signal by mixing said input signal with a further input signal.

The invention also relates to an apparatus comprising a mixer-system for converting a frequency of an input signal into a different frequency of an output signal by mixing said input signal with a further input signal, and to a method for converting a frequency of an input signal into a different frequency of an output signal by mixing said input signal with a further input signal.

Such a mixer-system for example either performs an up-conversion of frequencies, in which case said apparatus for example forms part of a transmitter, or performs a down-conversion, in which case said apparatus for example forms part of a receiver. Said apparatus may be for example a telecommunication apparatus, like for example a mobile phone or a modem or a transceiver etc., or may be for example an audio receiver, like a radio etc., or an audio/video receiver, like for example a television etc.

A prior art mixer-system is known from the article CMOS Mixers and Polyphase Filters for Large Image Rejection, IEEE Journal of Solide-State Circuits, Vol. 36, No. 6, June 2001, by Farbod Behbahani, Yoji Kishigami, John Leete and Asad A Abidi, which discloses in its FIG. 17 a double quadrature upconversion arrangement using two single quadrature mixers, and which discloses in its FIG. 20 a double quadrature downconversion mixer. For example in case of balanced I and Q signals, there are actually four signals, I, Q, −I, −Q, and large parts of the apparatus will show a fourfold repetition.

The known mixer-system is disadvantageous, inter alia, due to requiring many components in the mixer-system itself as well as in the apparatus, and therefore, when being integrated, requiring a large chip surface.

It is an object of the invention, inter alia, of providing a mixer-system as defined above which requires less components without degrading said converting.

Further objects of the invention are, inter alia, providing an apparatus as defined above, and providing a method as defined above which require less components without degrading said converting.

The mixer-system according to the invention for converting a frequency of an input signal into a different frequency of an output signal by mixing said input signal with a further input signal comprises at least three sub-inputs for receiving a first group of sub-signals and comprises at least three further sub-inputs for receiving a second group of sub-signals and comprises at least three sub-outputs for generating a third group of sub-signals, with at least said third group of sub-signals comprising three sub-signals with a first phase difference being present between a second sub-signal and a first sub-signal and with a second phase difference being present between a third sub-signal and said second sub-signal, which first phase difference and which second phase difference are each within an interval of 100–140 degrees.

By creating a three-phase mixer-system, compared to the four-phase situation with the balanced I and Q signals, less components will be necessary. In contrast to the I and Q signals, which needed to be balanced, the sub-signals (in the third group of sub-signals) R, S and T are already (substantially) balanced. And, when being integrated, (many) parts of the chip will be reduced to ¾ of the original surface.

A first embodiment of the mixer-system according to the invention is defined by claim 2.

In case of, for each group of sub-signals, said first phase difference and said second phase difference being each within said interval, the mixer-system has a more symmetrical construction, and the sub-signals (in each group of sub-signals) R, S and T are (substantially) balanced.

A second embodiment of the mixer-system according to the invention is defined by claim 3.

In case of said first phase difference and said second phase difference being each within an interval of 118–122 degrees, the sub-signals (in each group of sub-signals) R, S and T are even better balanced. In case of said first phase difference and said second phase difference being each 120 degrees, the sub-signals (in each group of sub-signals) R, S and T are perfectly balanced.

A third embodiment of the mixer-system according to the invention is defined by claim 4.

By introducing a group of transistors per sub-input, the sub-signals at the sub-inputs can be switched and/or amplified.

A fourth embodiment of the mixer-system according to the invention is defined by claim 5.

By introducing the further transistor per further sub-input each for switching one of said groups of transistors, an active mixer-system has been created.

A fifth embodiment of the mixer-system according to the invention is defined by claim 6.

In case of at least said transistors in each group of transistors being bipolar transistors, these transistors will be, when integrated, relatively similar to each other, and compensation for integration differences is either no longer necessary or just necessary at a reduced level. Said transistors may further have an amplifying function.

A sixth embodiment of the mixer-system according to the invention is defined by claim 7.

In case of a control electrode of each transistor of one group of transistors being coupled to control electrodes of one transistor of each other group of transistors and to a further sub-input, with first main electrodes of each group of transistors being coupled to each other and to a sub-input, and with a second main electrode of each transistor of one group of transistors being coupled to second main electrodes of one transistor of each other group of transistors and to a sub-output, a passive mixer-system has been created, which usually has a better linearity than an active mixer-system.

The apparatus according to the invention comprises a mixer-system for converting a frequency of an input signal into a different frequency of an output signal by mixing said input signal with a further input signal, wherein said mixer-system comprises at least three sub-inputs for receiving a first group of sub-signals and comprises at least three further sub-inputs for receiving a second group of sub-signals and comprises at least three sub-outputs for generating a third group of sub-signals, with at least said third group of sub-signals comprising three sub-signals with a first phase difference being present between a second sub-signal and a first sub-signal and with a second phase difference being present between a third sub-signal and said second sub-signal, which first phase difference and which second phase difference are each within an interval of 100–140 degrees, with said apparatus comprising at least one poly-phase filter coupled to said sub-outputs for combining said third group of sub-signals into said output signal.

Said at least one poly-phase filter will filter said third group of sub-signals and generate at least one filtering result in the form of said output signal.

A first embodiment of the apparatus according to the invention is defined by claim 8.

Said at least one further poly-phase filter will filter said input signal and generate at least one filtering result in the form of said first group of sub-signals. Said at least one yet further poly-phase filter will filter said further input signal and generate at least one filtering result in the form of said second group of sub-signals, and said at least one ring oscillator will generate said second group of sub-signals then together forming said further input signal.

Embodiments of the apparatus according to the invention and of the method according to the invention correspond with the embodiments of the mixer-system according to the invention.

The invention is based upon an insight, inter alia, that large parts of the prior art four-phase mixer-system will show a fourfold repetition, which requires many components, and is based upon a basic idea, inter alia, that a three-phase mixer-system will require less components.

The invention solves the problem, inter alia, of providing a mixer-system comprising less components without degrading said converting, and is advantageous, inter alia, in that no additional balancing is required.

These and other aspects of the invention will be apparent from and elucidated with reference to the embodiments(s) described hereinafter.

Figure 2:
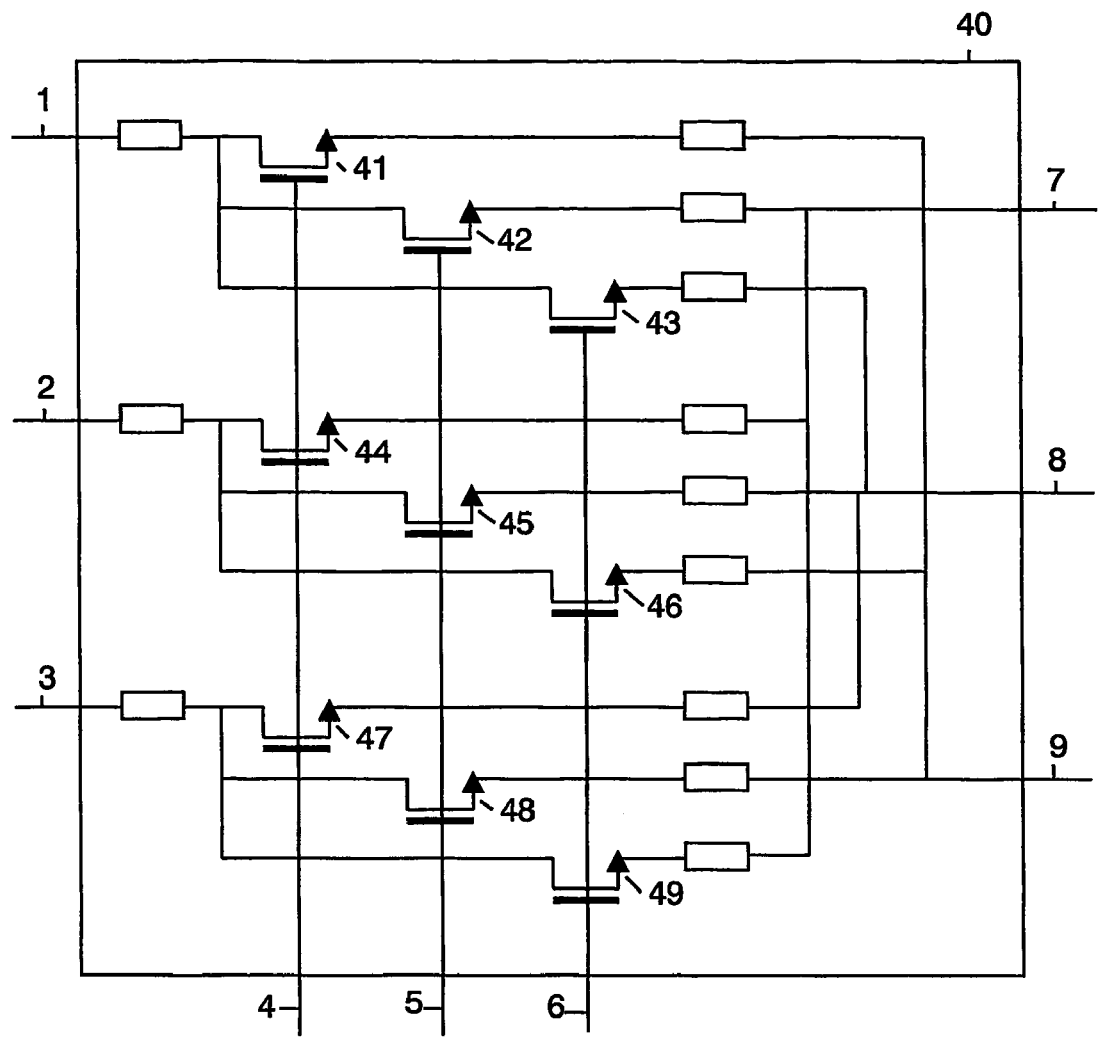
Figure 3:
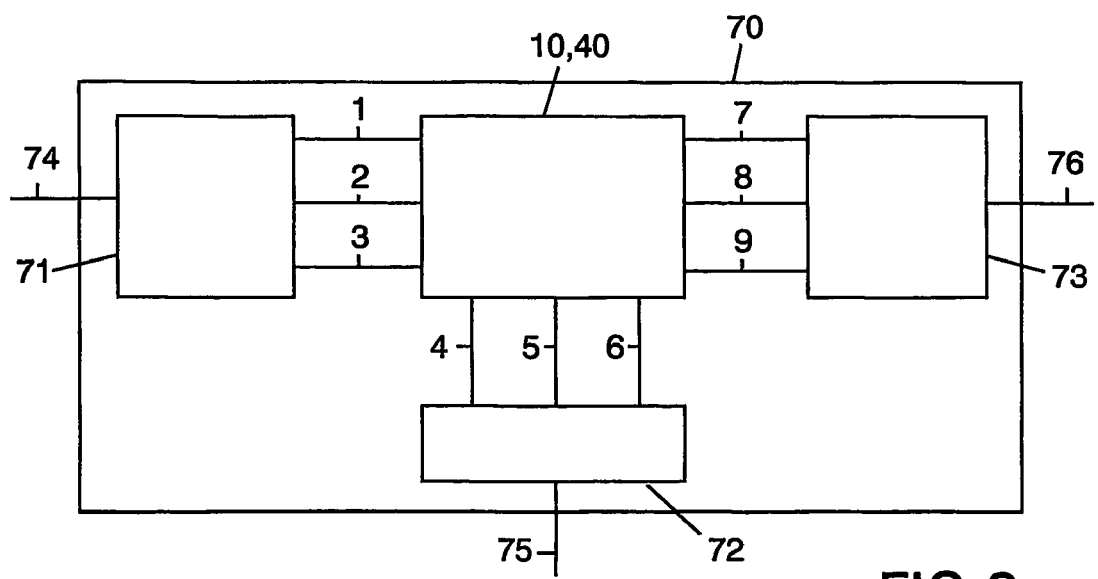

FIG. 1 illustrates schematically an active mixer-system according to the invention, FIG. 2 illustrates schematically a passive mixer-system according to the invention, and FIG. 3 illustrates in block diagram form an apparatus according to the invention comprising a mixer-system according to the invention.

The active mixer-system 10 according to the invention shown in FIG. 1 forms for example part of a transmitter (when upconverting) or a receiver (when downconverting) etc. and comprises three sub-inputs 1,2,3, three further sub-inputs 4,5,6 and three sub-outputs 7,8,9. Sub-input 1 is coupled to the control electrodes (like for example the basis) of transistors 12,15,18 and forms the R-sub-input. Sub-input 2 is coupled to the control electrodes of transistors 13,16,19 and forms the S-sub-input. Sub-input 3 is coupled to the control electrodes of transistors 11,14,17 and forms the T-sub-input.

Further sub-input 4 forms the further R-sub-input and is coupled to the control electrode of further transistor 20, of which a first main electrode (like for example the emitter) is coupled via a resistor to one side of a current source and of which a second main electrode (like for example the collector) is coupled to the first main electrodes of the first group of transistors 11–13. Further sub-input 5 forms the further S-sub-input and is coupled to the control electrode of further transistor 21, of which a first main electrode is coupled via a resistor to the one side of the current source and of which a second main electrode is coupled to the first main electrodes of the second group of transistors 14–16. Further sub-input 6 forms the further T-sub-input and is coupled to the control electrode of further transistor 22, of which a first main electrode is coupled via a resistor to the one side of the current source and of which a second main electrode is coupled to the first main electrodes of the third group of transistors 17–19. An other side of the current source is coupled to a first supply-line.

Second main electrodes of transistors 12,14,19 are coupled to sub-output 7 which forms the R-sub-output and via a resistor to a second supply-line. Second main electrodes of transistors 13,15,17 are coupled to sub-output 8 which forms the S-sub-output and via a resistor to the second supply-line. Second main electrodes of transistors 11,16,18 are coupled to sub-output 9 which forms the T-sub-output and via a resistor to the second supply-line.

In the active mixer-system 10 according to the invention, the transistors 11–19 are for example bipolar transistors etc., which also amplify the sub-signals arriving via the sub-inputs 1,2,3. Therefore, the weakest of both input signals (like for example an antenna signal etc.) is to be supplied to these sub-inputs 1,2,3. In case of being bipolar transistors, when being integrated, these transistors will be relatively similar to each other, and compensation for integration differences is either no longer necessary or just necessary at a reduced level. The further transistors 20–22 are for example bipolar transistors etc. which switch said groups of transistors 11–13,14–16,17–19 in dependence of the second group of sub-signals. Therefore, the strongest of both input signals (like for example an oscillation signal etc.) is to be supplied to these further sub-inputs 4,5,6.

The sub-signals at the further sub-inputs 4, 5, and 6 in FIG. 1 determine the way in which the sub-signals at the sub-inputs 1, 2 and 3 in FIG. 1 are being transfered to the sub-signals at the sub-outputs 7, 8, and 9 in FIG. 1. For those moments in time when, for the three sub-signals at the further sub-inputs 4, 5 and 6, the sub-signal at further sub-input 4 is of a higher voltage than the sub-signals at further sub-inputs 5 and 6, the sub-signals at the sub-inputs 1, 2 and 3 will predominantly be transfered from 1 to 7, from 2 to 8, and 3 to 9. If the sub-signal at further sub-input 5 has a higher voltage than the sub-signals at further sub-inputs 4 and 6, then the sub-signals at the sub-inputs 1, 2 and 3 will predominantly be transfered from 1 to 8, from 2 to 9, and 3 to 7. If, finally, the sub-signal at further sub-input 6 has a higher voltage than the sub-signals at further sub-inputs 4 and 5, then the sub-signals at the sub-inputs 1, 2 and 3 will predominantly be transfered from 1 to 9, from 2 to 7, and 3 to 8. In this way, the momentary phase of the sub-signals at the further sub-inputs 4, 5 and 6 will approximately be added to, or subtracted from, the phase of the sub-signals at the sub-inputs 1, 2 and 3, depending on the ordering within each group of three signals. This leads to sub-signals at the sub-outputs 7, 8 and 9 which contain substantial components with frequencies that are either the sum of, or the difference between the frequencies at the sub-inputs 1, 2 and 3 and the frequencies at the sub-inputs 4, 5 and 6. In the embodiment of FIG. 1 this is realized by means of the three further transistors 20, 21, and 22, which will determine the way in which the total current is divided over the set of nine transistors, 11–19. This division is determined by the momentary values of the sub-signals at the further sub-inputs 4, 5 and 6, which act as control signals for further transistors 20, 21 and 22. The resulting division of current will favor a group of three within the group of nine transistors, 11–19, in such a way that three possible paths for the sub-signals at the sub-inputs 1, 2 and 3 to the sub-signals at the sub-output are favored, in the way described above.

Compared to four prior art Gilbert cells in prior art mixer-systems, mixer-system 10 reduces the number of transistors from twenty-four to twelve (thereby not counting the transistors in the current sources). Alternatively, transistors 11–19 and/or further transistors 20–22 may be FETs etc.

The passive mixer-system 40 according to the invention shown in FIG. 2 forms for example part of a transmitter (when upconverting) or a receiver (when downconverting) etc. and comprises three sub-inputs 1,2,3, three further sub-inputs 4,5,6 and three sub-outputs 7,8,9. Sub-input 1 is coupled via a resistor to the second main electrodes (like for example the drain) of the first group of transistors 41,42,43 and forms the early-sub-input. Sub-input 2 is coupled via a resistor to the second main electrodes of the second group of transistors 44,45,46 and forms the normal-sub-input. Sub-input 3 is coupled via a resistor to the second main electrodes of the third group of transistors 47,48,49 and forms the late-sub-input. Said second main inputs receive for example an antenna signal etc.

Further sub-input 4 forms the further early-sub-input and is coupled to the control electrodes (like for example the gate) of transistors 41,44,47. Further sub-input 5 forms the further normal-sub-input and is coupled to the control electrodes of transistors 42,45,48. Further sub-input 6 forms the further late-sub-input and is coupled to the control electrodes of transistors 43,46,49. Said control electrodes receive for example an oscillation signal etc.

First main electrodes (like for example the source) of transistors 42,44,49 are each via a resistor coupled to sub-output 7 which forms the early-sub-output. First main electrodes of transistors 43,45,47 are each via a resistor coupled to sub-output 8 which forms the normal-sub-output. First main electrodes of transistors 41,46,48 are coupled to sub-output 9 which forms the late-sub-output.

In the passive mixer-system 40 according to the invention, the transistors 41–49 are for example FETs etc., which in dependence of the second group of sub-signals are switched from low impedance to high impedance and vice versa.

Again, similarly as described for FIG. 1, in FIG. 2 the sub-signals at the further sub-inputs 4, 5, and 6 determine the way in which the sub-signals at the sub-inputs 1, 2 and 3 are being transfered to the sub-signals at the sub-outputs 7, 8, and 9. Thereto, in FIG. 2 use is made of the way the impedances of the transistors are influenced by the momentary voltages at the control electrodes of said transistors, which are given by the sub-signals at the further sub-inputs 4, 5 and 6.

Compared to four passive mixers with four MOSTs each, mixer-system 40 reduces the number of transistors from sixteen to nine.

The apparatus 70 according to the invention shown in FIG. 3 may be for example a telecommunication apparatus, like for example a mobile phone or a modem or a transceiver etc., or may be for example an audio receiver, like a radio etc., or an audio/video receiver, like for example a television etc., and comprises mixer-system 10,40 according to the invention, at least one poly-phase filter 73 of which inputs are coupled to said sub-outputs 7,8,9 and of which an output generates the output signal 76, at least one further poly-phase filter 71 of which an input receives the input signal 74 and of which outputs are coupled to said sub-inputs 1,2,3, and either comprises at least one yet further poly-phase filter 72 of which outputs are coupled to said further sub-inputs 4,5,6 and of which an input receives the further input signal 75 or comprises at least one ring oscillator 72 of which outputs are coupled to said further sub-inputs 4,5,6 with said second group of sub-signals then forming the further input signal.

Poly-phase filter 73 is coupled to said sub-outputs 7,8,9 for combining said third group of sub-signals into said output signal 76. Thereto, poly-phase filter 73 will filter said third group of sub-signals and generate at least one filtering result in the form of said output signal 76.

Poly-phase filter 71 is coupled to said sub-inputs 1,2,3 for splitting said input signal 74 into said first group of sub-signals. Thereto, poly-phase filter 71 will filter said input signal 74 and generate at least one filtering result in the form of said first group of sub-signals.

Poly-phase filter 72 is coupled to said further sub-inputs 4,5,6 for splitting said further input signal 75 into said second group of sub-signals. Thereto, poly-phase filter 72 will filter said further input signal 75 and generate at least one filtering result in the form of said second group of sub-signals. Alternatively, ring oscillator 72 generates said second group of sub-signals which then together form said further input signal.

The expression "for" in for example "for converting" and "for receiving" and "for switching" etc. does not exclude that other functions are performed as well, simultaneously or not. The expressions "X coupled to Y" and "a coupling between X and Y" and "coupling/couples X and Y" etc. do not exclude that an element Z is in between X and Y. The expressions "P comprises Q" and "P comprising Q" etc. do not exclude that an element R is comprises/included as well. The terms "a" and "an" do not exclude the possible presence of one or more pluralities.

In FIG. 3, poly-phase filters 71,72,73 may comprise (correspond with) several poly-phase filters. Input signal 74 may alternatively be regarded to comprise (correspond with) said first group of sub-signals, further input signal 75 may alternatively be regarded to comprise (correspond with) said second group of sub-signals, and output signal 76 may alternatively be regarded to comprise (correspond with) said third group of sub-signals. Alternatives for said poly-phase filters are not to be excluded. The respective early-sub-input and normal-sub-input and late-sub-input may correspond with the respective R-sub-input and S-sub-input and T-sub-input.

The invention is based upon an insight, inter alia, that large parts of the prior art four-phase mixer-system will show a fourfold repetition, which requires many components, and is based upon a basic idea, inter alia, that a three-phase mixer-system will require less components.

The invention solves the problem, inter alia, of providing a mixer-system comprising less components without degrading said converting, and is advantageous, inter alia, in that no additional balancing is required.

The invention claimed is:

1. Mixer-system for converting a frequency of an input signal into a different frequency of an output signal by mixing said input signal with a further input signal, wherein said mixer-system comprises at least three sub-inputs for receiving a first group of sub-signals and comprises at least three further sub-inputs for receiving a second group of sub-signals and comprises at least three sub-outputs for generating a third group of sub-signals, with at least said third group of sub-signals comprising three sub-signals with a first phase difference being present between a second sub-signal and a first sub-signal and with a second phase difference being present between a third sub-signal and said second sub-signal, which first phase difference and which second phase difference are each within an interval of 100–140 degrees.

2. Mixer-system according to claim 1, wherein for each group of sub-signals said first phase difference and said second phase difference are each within said interval.

3. Mixer-system according to claim 2, wherein said first phase difference and said second phase difference are each within an interval of 118–122 degrees.

4. Mixer-system according to claim 2, wherein said mixer-system comprises a group of transistors per sub-input.

5. Mixer-system according to claim 4, wherein said mixer-system comprises a further transistor per further sub-input each for switching one of said groups of transistors, with control electrodes of said transistors per group being coupled to said sub-inputs and with control electrodes of said further transistors each being coupled to one of said further sub-inputs, with first main electrodes of said further transistors being coupled to each other and with second main electrodes of said further transistors each being coupled to all first main electrodes of one of said groups of transistors, and with a second main electrode of each transistor of one group of transistors being coupled to second main electrodes of one transistor of each other group of transistors and to a sub-output.

6. Mixer-system according to claim 5, wherein at least said transistors in each group of transistors are bipolar transistors.

7. Mixer-system according to claim 4, wherein a control electrode of each transistor of one group of transistors is coupled to control electrodes of one transistor of each other group of transistors and to a further sub-input, with first main electrodes of each group of transistors being coupled to each other and to a sub-input, and with a second main electrode of each transistor of one group of transistors being coupled to second main electrodes of one transistor of each other group of transistors and to a sub-output.

8. Apparatus comprising a mixer-system for converting a frequency of an input signal into a different frequency of an output signal by mixing said input signal with a further input signal, wherein said mixer-system comprises at least three sub-inputs for receiving a first group of sub-signals and comprises at least three further sub-inputs for receiving a second group of sub-signals and comprises at least three sub-outputs for generating a third group of sub-signals, with at least said third group of sub-signals comprising three sub-signals with a first phase difference being present between a second sub-signal and a first sub-signal and with a second phase difference being present between a third sub-signal and said second sub-signal, which first phase difference and which second phase difference are each within an interval of 100–140 degrees, with said apparatus comprising at least one poly-phase filter coupled to said sub-outputs for combining said third group of sub-signals into said output signal.

9. Apparatus according to claim 8, wherein said apparatus comprises at least one further poly-phase filter coupled to said sub-inputs for splitting said input signal into said first group of sub-signals and comprises either at least one yet further poly-phase filter coupled to said further sub-inputs for splitting said further input signal into said second group of sub-signals or at least one ring oscillator for generating said second group of sub-signals together forming said further input signal.

10. Method for converting a frequency of an input signal into a different frequency of an output signal by mixing said input signal with a further input signal, wherein said method comprises the steps of receiving a first group of sub-signals and of receiving a second group of sub-signals and of generating a third group of sub-signals, with at least said third group of sub-signals comprising three sub-signals with a first phase difference being present between a second sub-signal and a first sub-signal and with a second phase difference being present between a third sub-signal and said second sub-signal, which first phase difference and which second phase difference are each within an interval of 100–140 degrees.

* * * * *